United States Patent
Oh et al.

(10) Patent No.: US 11,794,547 B2
(45) Date of Patent: Oct. 24, 2023

(54) INTEGRATED THERMAL MANAGEMENT MODULE FOR VEHICLE

(71) Applicants: Hyundai Motor Company, Seoul (KR); Kia Motors Corporation, Seoul (KR)

(72) Inventors: Man Ju Oh, Yongin-si (KR); So La Chung, Seoul (KR); Jae Woong Kim, Hwaseong-si (KR); Sang Shin Lee, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 765 days.

(21) Appl. No.: 16/682,174

(22) Filed: Nov. 13, 2019

(65) Prior Publication Data

US 2020/0398633 A1    Dec. 24, 2020

(30) Foreign Application Priority Data

Jun. 19, 2019   (KR) ......................... 10-2019-0072604

(51) Int. Cl.
   *B60H 1/00*    (2006.01)
   *H05K 7/20*    (2006.01)
   (Continued)

(52) U.S. Cl.
   CPC ...... *B60H 1/00278* (2013.01); *H01M 10/613* (2015.04); *H01M 10/625* (2015.04); *H05K 7/20327* (2013.01)

(58) Field of Classification Search
   CPC ........... B60H 1/00278; H05K 7/20327; H01M 10/613; H01M 10/625
   See application file for complete search history.

(56) References Cited

U.S. PATENT DOCUMENTS 2,274,152 A * 2/1942 McGrath ................. F24F 11/30
                                                    236/1 C
4,646,688 A * 3/1987 Hirano .................... F01P 11/18
                                                    123/41.27
(Continued)

FOREIGN PATENT DOCUMENTS

KR          10-1448656 B1    10/2014
KR      10-2018-0085958 A     7/2018
(Continued)

OTHER PUBLICATIONS

Balancing_of_rotating_masses-Wikipedia-2016 (Year: 2022).*

*Primary Examiner* — Nael N Babaa
(74) *Attorney, Agent, or Firm* — MORGAN, LEWIS & BOCKIUS LLP (57) ABSTRACT

An integrated thermal management module for a vehicle may include a chiller; a first reservoir portion through which electric part-cooling water passes, and a second reservoir portion through which high-voltage battery-cooling water passes; a first pump that circulates the electric part-cooling water through an electric portion, and a first valve that controls cooling water that has passed through the chiller or cooling water of the first reservoir portion to be selectively circulated through the electric portion by the first pump; and a second pump that circulates the high-voltage battery-cooling water through a high-voltage battery, and a second valve that controls the cooling water that has passed through the chiller or cooling water of the second reservoir portion to be selectively circulated through the high-voltage battery by the second pump.

15 Claims, 6 Drawing Sheets

(51) Int. Cl.
  *H01M 10/625* (2014.01)
  *H01M 10/613* (2014.01)

(56) References Cited

U.S. PATENT DOCUMENTS

| | | | | |
|---|---|---|---|---|
| 5,478,443 | A | * 12/1995 | Cogat | A23L 27/11 |
| | | | | 159/901 |
| 6,562,952 | B1 | * 5/2003 | Rajewski | A61K 9/1688 |
| | | | | 530/424 |
| 2001/0034435 | A1 | * 10/2001 | Nochumson | C12N 15/1017 |
| | | | | 435/270 |
| 2009/0152032 | A1 | 6/2009 | Klotten et al. | |
| 2012/0272948 | A1 | * 11/2012 | Kristjansson | F24D 11/0221 |
| | | | | 165/104.11 |
| 2017/0008407 | A1 | 1/2017 | Porras et al. | |
| 2018/0306472 | A1 | * 10/2018 | Molavi | F25B 43/02 |
| 2019/0145719 | A1 | * 5/2019 | Meskin | B60K 11/04 |
| | | | | 165/67 |
| 2020/0009939 | A1 | * 1/2020 | Potticary | F01P 11/029 |
| 2020/0080757 | A1 | * 3/2020 | Suzuki | F25B 41/22 |
| 2020/0101816 | A1 | * 4/2020 | Takagi | B60H 1/32 |
| 2020/0391570 | A1 | * 12/2020 | Lee | B60H 1/32284 |

FOREIGN PATENT DOCUMENTS

| | | |
|---|---|---|
| KR | 10-2018-0099007 A | 9/2018 |
| KR | 10-2019-0033115 A | 3/2019 |

\* cited by examiner

INTEGRATED THERMAL MANAGEMENT MODULE FOR VEHICLE

CROSS-REFERENCE TO RELATED APPLICATION

The present application claims priority to Korean Patent Application No. 10-2019-0072604, filed on Jun. 19, 2019 in the Korean Intellectual Property Office, the entire contents of which is incorporated herein for all purposes by this reference.

BACKGROUND OF THE PRESENT INVENTION

Field of the Invention

The present invention relates to an integrated thermal management module for a vehicle which is mounted on a vehicle, may be made compact by integrating complicated portions related to cooling water and a refrigerant into an assembly, and can increase cooling/heating efficiency by reducing the resistance of the cooling water or refrigerant.

Description of Related Art

It is difficult to use waste heat in an electric vehicle or a fuel cell vehicle because there is no engine. Accordingly, it is unavoidable to use an electric compressor for cooling and a heat pump principle or a separate electric heater for heating in these vehicles.

Furthermore, it is required to secure maximum cooling/heating efficiency in these vehicles to secure a mileage to electrical energy and these technologies are directly connected to the commercial values of the vehicles.

Accordingly, the cooling/heating circuit is somewhat complicated and several valves, pumps, and other parts are mounted in electric vehicles. Therefore, there is a demand for a technology that can easily install these parts and reduce weight and costs by effectively arranging and integrating the parts into an assembly.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing an integrated thermal management module for a vehicle which is mounted on a vehicle, may be made compact by integrating complicated parts related to cooling water and a refrigerant into an assembly, and can increase cooling/heating efficiency by reducing the resistance of the cooling water or refrigerant.

In view of an aspect, an integrated thermal management module for a vehicle according to an exemplary embodiment of the present invention includes: a chiller through which refrigerant and cooling water pass to exchange heat with each other; a first reservoir portion through which electric part-cooling water passes, and a second reservoir portion through which high-voltage battery-cooling water passes; a first pump that circulates the electric part-cooling water through an electric portion, and a first valve that controls cooling water that has passed through the chiller or cooling water of the first reservoir portion to be selectively circulated through the electric portion by the first pump; and a second pump that circulates the high-voltage battery-cooling water through a high-voltage battery, and a second valve that controls the cooling water that has passed through the chiller or cooling water of the second reservoir portion to be selectively circulated through the high-voltage battery by the second pump.

The chiller, the first reservoir portion, and the second reservoir portion may configure one assembly by being directly or indirectly connected to one another.

The first reservoir portion, the first pump, and the first valve may configure one assembly by being directly or indirectly connected to one another.

The second reservoir portion, the second pump, and the second first valve may configure one assembly by being directly or indirectly connected to one another.

The first reservoir portion and the second reservoir portion may be spaced a predetermined distance apart from each other and may form one reservoir tank with upper portions of internal spaces connected to each other.

The first reservoir portion and the second reservoir portion may be mounted adjacent to each other and the chiller may be mounted adjacent to a side of the first reservoir portion and the second reservoir portion.

The first valve may be a three-way valve and is connected to a lower portion of the first reservoir portion, a lower portion of the chiller, and an inlet of the first pump and may control the electric part-cooling water of the first reservoir portion or the cooling water of the chiller to be supplied to the first pump.

The second valve may be a three-way valve and is connected to a lower portion of the second reservoir portion, a lower portion of the chiller, and an inlet of the second pump and may control the high-voltage battery-cooling water of the second reservoir portion or the cooling water of the chiller to be supplied to the second pump.

The chiller, the first reservoir portion, the second reservoir portion, the first valve, the second valve, the first pump, and the second pump may be configured as one assembly by being directly or indirectly connected to one another, and the assembly may be mounted on a vehicle body by fastening the first reservoir portion or the second reservoir portion to the vehicle body through a damper.

The first pump and the second pump may be mounted such that their rotation shafts cross each other.

The first reservoir portion and the second reservoir portion may be spaced a predetermined distance apart from each other and may form one reservoir tank with upper portions of internal spaces connected to each other, the chiller may be mounted adjacent to a side of the reservoir tank, the first valve and the first pump may be mounted under the first reservoir portion, and the second valve and the second pump may be mounted under the second reservoir portion.

An inlet of the first reservoir portion may be connected to an electric portion radiator, an outlet of the first reservoir portion may be connected to the first valve, and an outlet of the first pump may be connected to the electric portion.

An inlet of the second reservoir portion may be connected to a high-voltage battery radiator, an outlet of the second reservoir portion may be connected to the second valve, and an outlet of the second pump may be connected to the high-voltage battery.

The chiller may have a first inlet, a second inlet, a first outlet, and a second outlet for flow of cooling water, the first inlet may be connected to the electric portion, and the first outlet may be connected to the first valve.

The second inlet of the chiller may be connected to the high-voltage battery and the second outlet of the chiller may be connected to the second valve.

According to an integrated thermal management module for a vehicle of the present invention, the integrated thermal management module is mounted on a vehicle, may be made compact by integrating complicated parts related to cooling water and a refrigerant into an assembly, and can increase cooling/heating efficiency by reducing the resistance of the cooling water or refrigerant.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Figure 1:
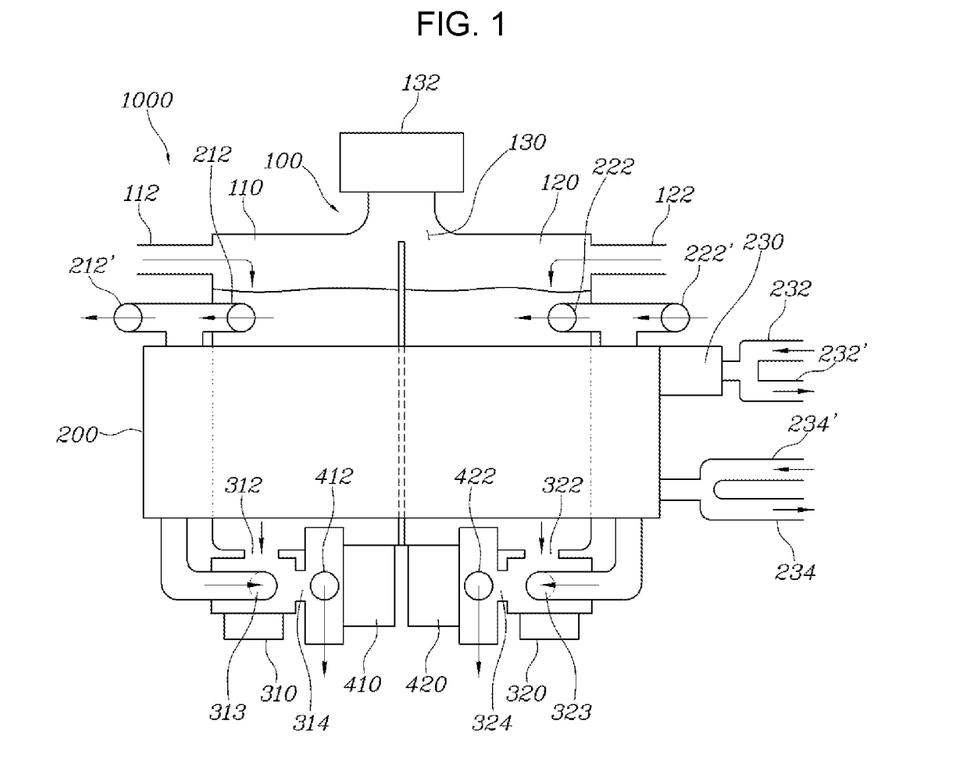
FIG. 1 is a view showing an integrated thermal management module for a vehicle according to an exemplary embodiment of the present invention.
Figure 2:
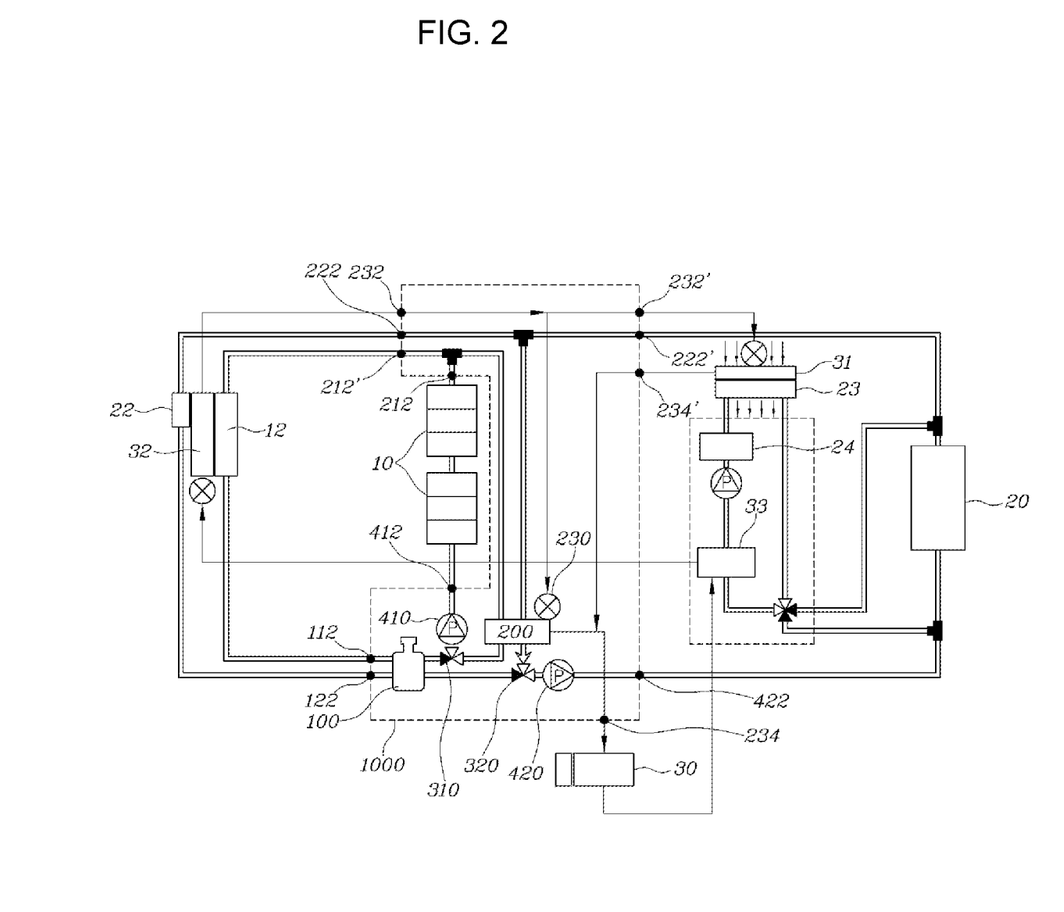
FIG. 2 is a view showing an automotive cooling/heating circuit to which the integrated thermal management module for a vehicle according to an exemplary embodiment of the present invention has been applied.

FIG. 1 is a view showing an integrated thermal management module for a vehicle according to an exemplary embodiment of the present invention, FIG. 2 is a view showing an automotive cooling/heating circuit to which the integrated thermal management module for a vehicle according to an exemplary embodiment of the present invention has been applied, and FIG. 3, FIG. 4, FIG. 5 and FIG. 6 are views illustrating an integrated thermal management module for a vehicle according to various exemplary embodiments of the present invention.

FIG. 1 is a view showing an integrated thermal management module for a vehicle according to an exemplary embodiment of the present invention. The integrated thermal management module for a vehicle according to an exemplary embodiment of the present invention includes: a chiller 200 through which refrigerant and cooling water pass to exchange heat with each other; a first reservoir portion 110 through which electric part-cooling water passes and a second reservoir portion 120 through which high-voltage battery-cooling water passes; a first pump 410 that circulates the electric part-cooling water through an electric portion 10 and a first valve 310 that controls the cooling water that has passed through the chiller 200 or the cooling water of the first reservoir portion 110 to be selectively circulated through the electric portion 10 by the first pump 410; and a second pump 420 that circulates the high-voltage battery-cooling water through a high-voltage battery 20 and a second valve 320 that controls the cooling water that has passed through the chiller 200 or the cooling water of the second reservoir portion 120 to be selectively circulated through the high-voltage battery 20 by the second pump 420.

FIG. 2 is a view showing an automotive cooling/heating circuit to which the integrated thermal management module for a vehicle according to an exemplary embodiment of the present invention has been applied. First, an example to which the integrated thermal management module for a vehicle of the present invention is applied is described with reference to the circuit shown in FIG. 2.

Vehicles to which the module of the present invention is applied may be various vehicles including an internal combustion engine vehicle, but an effect may be the largest in a vehicle which is driven by electric parts such as an electric vehicle.

Vehicles are provided with various heat generation devices, and the electric portion 10 including a motor and an inverter, a high-voltage battery 20, and an automotive air-conditioning system are the heat generation mechanisms. These devices require to be managed in different temperature ranges and also have different start time points, so a complicated circuit is required, as shown in FIG. 2, to independently implement the same.

As may be seen from FIG. 2, the electric portion 10 may be cooled by an electric portion radiator 12 using cooling water or by the chiller 200. The high-voltage battery 20 can also be cooled by a high-voltage battery radiator 22 using cooling water or by the chiller 200.

The chiller 200 is a portion where a refrigerant line and a cooling water line meet each other and exchange heat with each other. The refrigerant circulates in order of a compressor 30, a water-cooling condenser 33, an air-cooling condenser 32, and an evaporator 31 of an air-conditioning system or the chiller 200. When the refrigerant circulates to the chiller 200, the electric portion 10 or the high-voltage battery 20 are cooled by cooling water cooled through the chiller 200, and when the refrigerant circulates to the evaporator 31, internal cooling is performed.

In internal heating, heating is performed by sending cooling water heated through a water-cooling condenser 33 into a heater core 23 or by circulating cooling water heated through a water-heating heater 24 to the heater core 23.

If necessary, it may be possible to perform heating by recovering waste heat of the electric portion 10 to the chiller 200 and transmitting the waste heat to the heater core 23 of the air-conditioning system through the water-cooling condenser 33.

In the circuit to which the integrated module of the present invention is applied, as described above, various modes may be independently or integrally implemented.

The circuit shown in FIG. 2 is very complicated and has many lines, so it is heavy and charges a large space in a vehicle, which is very disadvantageous in terms of design. Accordingly, it is required to make the circuit more efficient and compact, and for the present purpose, the integrated module shown in FIG. 1 is provided.

FIG. 1 is a view showing an integrated thermal management module for a vehicle according to an exemplary embodiment of the present invention. The integrated thermal management module for a vehicle according to an exemplary embodiment of the present invention includes: a chiller 200 through which refrigerant and cooling water pass to exchange heat with each other; a first reservoir portion 110 through which electric part-cooling water passes and a second reservoir portion 120 through which high-voltage battery-cooling water passes; a first pump 410 that circulates the electric part-cooling water through an electric portion 10 and a first valve 310 that is connected to the first pump 410 through a passage 314 and controls the cooling water that has passed through the chiller 200 or the cooling water of the first reservoir portion 110 to be selectively circulated through the electric portion 10 by the first pump 410; and a second pump 420 that is connected to the second valve 320 through a passage 324 and circulates the high-voltage battery-cooling water through a high-voltage battery 20 and a second valve 320 that controls the cooling water that has passed through the chiller 200 or the cooling water of the second reservoir portion 120 to be selectively circulated through the high-voltage battery 20 by the second pump 420.

An integrated module 1000 in an exemplary embodiment of the present invention is formed by integrating the portion divided in a box of FIG. 2, in which the portion that has the largest volume and size is a reservoir. Furthermore, since the management temperatures of the electric portion 10 and the high-voltage battery 20 are different, the internal space of the reservoir includes two separate spaces. Furthermore, cooling water is supplemented through one inlet 132, and if it is insufficient, they exchange some of cooling water with each other, preventing a problem with the performance.

To the present end, various aspects of the present invention provide the first reservoir portion 110 through which electric part-cooling water passes and the second reservoir portion 120 through which high-voltage battery-cooling water passes. Furthermore, the first reservoir portion 110 and the second reservoir portion 120 may be directly or indirectly connected to each other to form one assembly, and the first reservoir portion 110 and the second reservoir portion 120 may be spaced a predetermined distance apart from each other and the upper portions of their internal spaces may be connected, forming one reservoir tank 100.

In the exemplary embodiment shown in the figures, the first reservoir portion 110 and the second reservoir portion 120 have a structure in which they are formed as one tank, form independent spaces by being spaced from each other, and share an inlet by connecting the upper portions, and some of cooling water can supplement each other when a vehicle inclines or is accelerated to a side thereof. Furthermore, it is possible to prevent heat exchange through the gap of the reservoir portions and to interpose an insulator such that temperatures may be more completely and independently managed.

Furthermore, there is provided the chiller 200 through which refrigerant and cooling water pass and exchange heat with each other. The chiller 200, the first reservoir portion 110, and the second reservoir portion 120 can configure one assembly by being directly or indirectly connected to one another.

A refrigerant and cooling water exchange heat with each other through the chiller 200, and a line through which the refrigerant flows and a line through which cooling line flows are separately mounted in the chiller 200.

An expansion valve 230 is mounted on the chiller 200 and a cold refrigerant flows into the chiller 200, exchanges heat with cooling water, and is then discharged through an outlet. The chiller 200 has a first inlet 212, a second inlet 222', a first outlet 313, and a second outlet 323 for the flow of cooling water. The first inlet 212 may be connected to the electric portion 10 and the first outlet 313 may be connected to the first valve 310. Furthermore, the second inlet 222' of the chiller 200 may be connected to the high-voltage battery 20 and the second outlet 323 may be connected to the second valve 320.

Accordingly, it is possible to cool the electric portion 10 or the high-voltage battery 20 using the chiller 200.

In an exemplary embodiment of the present invention, the expansion valve 230 includes inlet portion 232 formed of inlet 232 and outlet 232'.

In an exemplary embodiment of the present invention, the chiller 200 is formed of inlet 234' and outlet 234.

Furthermore, it is possible to make cooling water circulate only through the electric portion radiator 12 or the high-voltage battery radiator 22 with passing through the chiller 200 by controlling a 'T'-shaped diverging point, the auxiliary input and outlet 212' and 222, and the valves 310 and 320. That is, it may also possible to remove heat of the electric portion 10 or the high-voltage battery 20 using not the chiller 200, but the radiators 12 and 22. This case, which is a case with a somewhat mild cooling condition, is a case that can save electrical energy because the compressor 30 is not operated. In the instant case, cooling water is circulated not to the chiller 200, but to the radiators 12 and 22 by controlling the first valve 310 or the second valve 320.

In detail, the first valve 310 is a three-way valve and is connected to the lower portion of the first reservoir portion 110, the lower portion of the chiller 200, and the inlet of the first pump 410 and controls the electric part-cooling water of the first reservoir portion 110 or the cooling water of the chiller 200 to be supplied to the first pump 410. That is, it is possible to cool the electric portion 10 using the electric portion radiator 12 or the chiller 200 by controlling the first valve 310.

Furthermore, the second valve 320 is a three-way valve and is connected to the lower portion of the second reservoir portion 120, the lower portion of the chiller 200, and the inlet of the second pump 420 and controls the high-voltage battery-cooling water of the second reservoir portion 120 or the cooling water of the chiller 200 to be supplied to the second pump 420. Therefore, similarly, it is also possible to cool the high-voltage battery 20 using the high-voltage battery radiator 22 or the chiller 200 by controlling the second valve 320.

To the present end, the inlet 112 of the first reservoir portion 110 may be connected to the electric portion radiator 12, the outlet 312 may be connected to the first valve 310, and the outlet 412 of the first pump 410 may be connected to the electric portion 10. Furthermore, the inlet 122 of the second reservoir portion 120 may be connected to the high-voltage battery radiator 22, the outlet 322 may be connected to the second valve 320, and the outlet 422 of the second pump 420 may be connected to the high-voltage battery 20.

The first reservoir portion 110, the first pump 410, and the first valve 310 may be directly or indirectly connected into one assembly. Furthermore, the second reservoir portion 120, the second pump 420, and the second valve 320 may be directly or indirectly connected into one assembly. As described above, the components may be configured as independent modules and then assembled.

The first reservoir portion 110 and the second reservoir portion 120 may be mounted adjacent to each other and the chiller 200 may be mounted adjacent to a side of the first reservoir portion 110 and the second reservoir portion 120.

Consequently, according to the integrated module 1000 of the present invention, the first reservoir portion 110 and the second reservoir portion 120 may be spaced a predetermined distance apart from each other and form one reservoir tank 100 with the upper portions of the internal spaces connected to each other, the chiller 200 may be mounted adjacent to a side of the reservoir tank 100, the first valve 310 and the first pump 410 may be mounted under the first reservoir portion 110, and the second valve 320 and the second pump 420 may be mounted under the second reservoir portion 120.

The chiller 200, the first reservoir portion 110, the second reservoir portion 120, the first valve 310, the second valve 320, the first pump 410, and the second pump 420 may be configured as one assembly by being directly or indirectly connected to one another, and the assembly may be mounted on a vehicle body B by fastening the first reservoir portion 110 or the second reservoir portion 120 to the vehicle body B through a damper D.

The reservoir parts are parts having the largest mass and can offset vibration of a pump. Accordingly, the reservoir parts are mounted on the vehicle body B through the damper D to primarily damp vibration.

Figure 3:
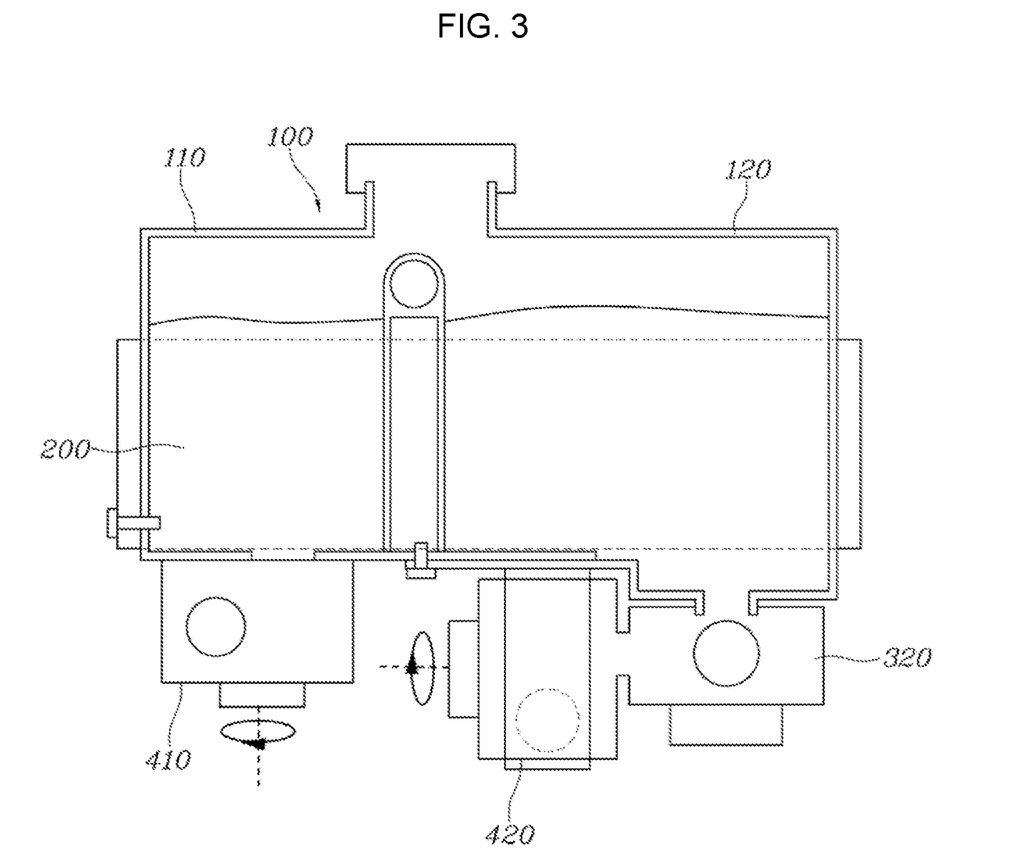
FIG. 3, FIG. 4, FIG. 5 and FIG. 6 are views illustrating an integrated thermal management module for a vehicle according to various exemplary embodiments of the present invention.
Figure 4:
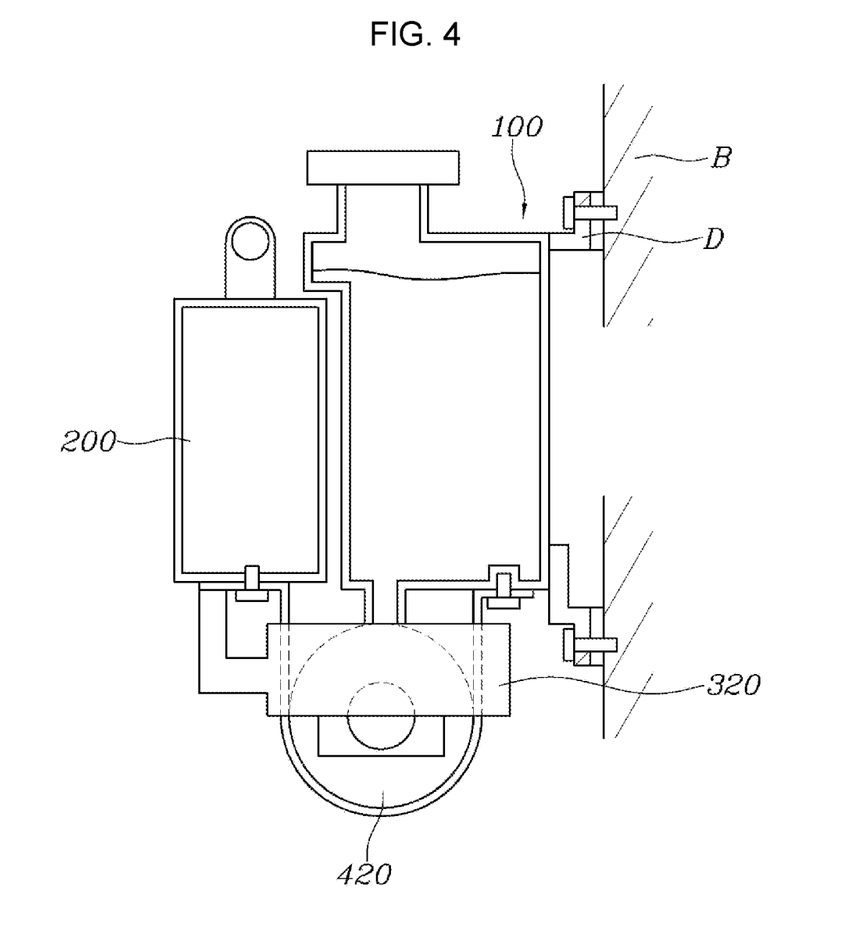

FIG. 3 and FIG. 4 show an integrated thermal management module according to various exemplary embodiments of the present invention, in which the first pump 410 and the second pump 420 may be mounted such that their rotation shafts cross each other.

Figure 5:
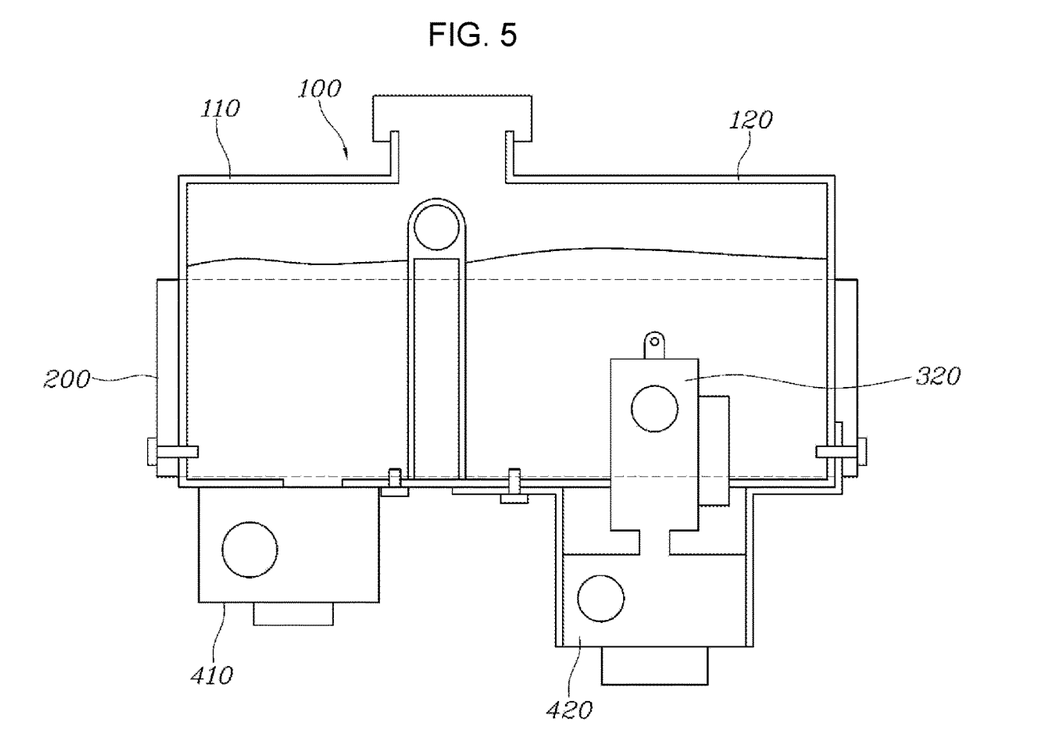
Figure 6:
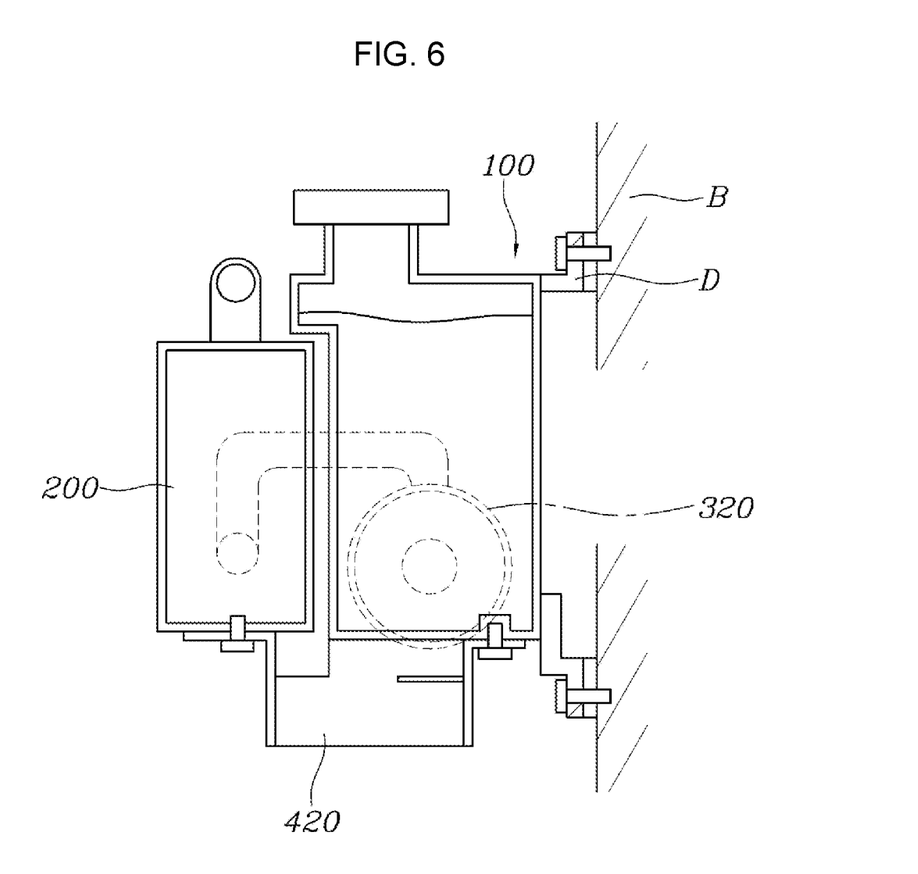

That is, since the first pump 410 and the second pump 420 may be mounted such that their rotation shafts cross each other, the directions of vibration of the pumps may be made different, whereby it is possible to prevent vibration of the pumps from increasing. FIG. 5 and FIG. 6 show an integrated thermal management module according to various exemplary embodiments of the present invention, in which the first valve and the second valve 320 are mounted across each other, whereby the integrated thermal management module of the present invention may be easily mounted in the layout of a vehicle.

According to an integrated thermal management module for a vehicle of the present invention, the integrated thermal management module is mounted on a vehicle, may be made compact by integrating complicated parts related to cooling water and a refrigerant into an assembly, and can increase cooling/heating efficiency by reducing the resistance of the cooling water or refrigerant.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An integrated thermal management module for a vehicle, the module comprising:
   a chiller through which refrigerant and cooling water pass to exchange heat with each other;
   a first reservoir portion through which electric part-cooling water passes;
   a second reservoir portion through which battery-cooling water passes;
   a first pump that circulates the electric part-cooling water through an electric portion;
   a first valve that controls the cooling water that has passed through the chiller or cooling water of the first reservoir portion to be selectively circulated through the electric portion by the first pump; and
   a second pump that circulates the battery-cooling water through a battery; and
   a second valve that controls the cooling water that has passed through the chiller or cooling water of the second reservoir portion to be selectively circulated through the battery by the second pump,
   wherein the first valve is a three-way valve and is fluidically connected to a lower portion of the first reservoir portion, a lower portion of the chiller, and an inlet of the first pump, and
   wherein the second valve is a three-way valve and is fluidically connected to a lower portion of the second reservoir portion, a lower portion of the chiller, and an inlet of the second pump.

2. The integrated thermal management module of claim 1, wherein the chiller, the first reservoir portion, and the second reservoir portion form one assembly by being directly or indirectly connected to one another.

3. The integrated thermal management module of claim 1, wherein the first reservoir portion, the first pump, and the first valve form one assembly by being directly or indirectly connected to one another.

4. The integrated thermal management module of claim 1, wherein the second reservoir portion, the second pump, and the second valve form one assembly by being directly or indirectly connected to one another.

5. The integrated thermal management module of claim 1, wherein the first reservoir portion and the second reservoir portion are spaced a predetermined distance apart from each other and form one reservoir tank with upper portions of internal spaces connected to each other.

6. The integrated thermal management module of claim 1, wherein the first valve controls the electric part-cooling water of the first reservoir portion or the cooling water of the chiller to be supplied to the first pump.

7. The integrated thermal management module of claim 1, wherein the second valve controls the battery-cooling water of the second reservoir portion or the cooling water of the chiller to be supplied to the second pump.

8. The integrated thermal management module of claim 1, wherein the chiller, the first reservoir portion, the second reservoir portion, the first valve, the second valve, the first pump, and the second pump are formed as one assembly by being directly or indirectly connected to one another, and the one assembly is mounted on a vehicle body by fastening the first reservoir portion or the second reservoir portion to the vehicle body through a damper.

9. The integrated thermal management module of claim 1, wherein the first pump and the second pump are mounted so that axes of rotation shafts of the first pump and the second pump cross each other.

10. The integrated thermal management module of claim 1, wherein the first reservoir portion and the second reservoir portion are spaced a predetermined distance apart from each other and form one reservoir tank with upper portions of internal spaces connected to each other, the first valve and the first pump are mounted under the first reservoir portion, and the second valve and the second pump are mounted under the second reservoir portion.

11. The integrated thermal management module of claim 1, wherein an inlet of the first reservoir portion is connected to an electric portion radiator, an outlet of the first reservoir portion is connected to the first valve, and an outlet of the first pump is connected to the electric portion.

12. The integrated thermal management module of claim 1, wherein an inlet of the second reservoir portion is connected to a battery radiator, an outlet of the second reservoir portion is connected to the second valve, and an outlet of the second pump is connected to the battery.

13. The integrated thermal management module of claim 1, wherein the chiller has a first inlet, a second inlet, a first outlet, and a second outlet for flow of cooling water, the first inlet is connected to the electric portion, and the first outlet is connected to the first valve.

14. The integrated thermal management module of claim 13, wherein the second inlet of the chiller is connected to the battery and the second outlet of the chiller is connected to the second valve.

15. The integrated thermal management module of claim 1, wherein the first reservoir portion and the second reservoir portion are mounted adjacent to each other and the chiller is mounted adjacent to a side of the first reservoir portion and the second reservoir portion.

* * * * *